(12) United States Patent
Sasaki et al.

(10) Patent No.: US 6,455,101 B1
(45) Date of Patent: Sep. 24, 2002

(54) METHOD FOR DEPOSITING A PROTECTIVE CARBON COATING ON A DATA RECORDING DISK

(75) Inventors: Hiromi Sasaki; Osamu Watabe; Naoki Watanabe, all of Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/618,786

(22) Filed: Jul. 18, 2000

(30) Foreign Application Priority Data

Jul. 28, 1999 (JP) .......................................... 11-214370

(51) Int. Cl.[7] ................................................. B05D 5/12
(52) U.S. Cl. .................... 427/130; 427/131; 427/372.2; 427/402; 428/65.5; 428/65.8; 428/900
(58) Field of Search .................................. 427/130, 131, 427/372.2, 402; 428/65.5, 65.8, 900

(56) References Cited

U.S. PATENT DOCUMENTS

| | | |
|---|---|---|
| 4,674,434 A | 6/1987 | Ishihara |
| 5,181,556 A | 1/1993 | Hughes ...................... 165/80.1 |
| 5,287,914 A | 2/1994 | Hughes ...................... 165/80.1 |
| 5,846,328 A | 12/1998 | Aruga et al. |
| 5,910,342 A | 6/1999 | Hirooka et al. |
| 6,027,618 A | 2/2000 | Aruga et al. |
| 6,176,932 B1 | 1/2001 | Watanabe et al. |
| 6,250,374 B1 | 6/2001 | Fujino et al. |

FOREIGN PATENT DOCUMENTS

| | | |
|---|---|---|
| JP | 61-26679 | 2/1986 |
| JP | 7-073454 | 3/1995 |
| JP | 10-298759 | 11/1998 |

*Primary Examiner*—Bernard Pianalto
(74) *Attorney, Agent, or Firm*—Burns, Doane, Swecker & Mathis, LLP

(57) ABSTRACT

A method and apparatus for depositing a protective film on a data recording disk, including the steps of depositing a magnetic film layer as a data recording layer on a surface of a substrate while the substrate is at a magnetic film deposition temperature; heating the substrate with the magnetic film layer thereon to a protective film deposition temperature; and depositing a protective film on the magnetic film layer while the substrate is at the protective film deposition layer; wherein the protective film deposition temperature is higher than the magnetic film deposition temperature.

9 Claims, 9 Drawing Sheets

METHOD FOR DEPOSITING A PROTECTIVE CARBON COATING ON A DATA RECORDING DISK

CROSS-REFERENCE TO RELATED APPLICATIONS

The present application corresponds to and claims the priority of Japanese Patent Application No. 11-214370, filed on Jul. 28, 1999, the entire contents of which are hereby incorporated herein by reference.

BACKGROUND OF THE INVENTION

1. Technical Field of the Invention

The present invention relates to the production of magnetic films with protective layers, and more specifically to the deposition of a protective film on top of a magnetic film which is used as a data recording layer on a data recording disk.

2. Description of Related Art

Data recording disks such as hard disks and CD-ROMs are already well known. Data recording disks of this sort are constructed by forming a recording layer on which data is recorded on the surface of a substrate made of metal or a dielectric material. The recording layer is produced by subjecting the substrate to surface processing. This surface processing is described below, taking the production of a hard disk as an example.

In the production of a conventional hard disk, a metal foundation film of Cr, or the like, is produced by sputtering onto a substrate made of aluminum coated with NIP, and then a magnetic film of CoCrTa, or the like, is formed as a recording layer by sputtering thereupon. A protective film consisting of a thin carbon film, or the like, is then provided on top of the magnetic film by a similar sputtering process as used to deposit the foundation film or magnetic film, thereby producing the finished hard disk.

In the above-mentioned data recording disk, the protective film on top of the magnetic film is provided to protect the magnetic film against collisions and wear from the record/playback head and to ensure its durability, and must be a solid film with lubricating properties. On the other hand, to increase the recording density, the protective film should be made thinner. That is, as the recording density increases, the distance between sectors decreases. As the distance between sectors decreases, the distance between the magnetic film and the record/playback head also has to be made smaller. In other words, the protective film has to be a small thickness while maintaining sufficient hardness.

To meet such demands, studies have been made into the deposition of protective films by chemical vapor deposition (CVD) instead of conventional sputtering. CVD is a procedure in which a prescribed precursor gas is activated by conferring energy to it, and a gas-phase reaction is used to deposit a prescribed thin film on a substrate. When CVD is used to deposit a thin carbon film as a protective film, a hydrocarbon gas such as $CH_4$ is used. A plasma is then produced by conferring energy to this $CH_4$ or other gas. The $CH_4$ or other gas dissociates in the plasma, and a carbon film is deposited as the carbon produced as a result of this dissociation reaches the surface of the substrate.

In a CVD process using a hydrocarbon gas of this sort, it is possible to deposit a so-called diamond-like carbon (DLC) film. A DLC film is a film formed by carbon that dissociates from the precursor gas and crystallizes with a diamond-like structure on the surface of the substrate. Since a DLC film has a diamond structure, it is expected that it can be made thinner and harder than a film deposited by sputtering using a graphite target.

However, no reports have been made regarding the optimal deposition conditions for protective films of this sort. Therefore, on researching the optimal deposition conditions for protective films, it was found that there is a constant problem from the mutual differences between the optimal deposition conditions for the magnetic film deposited before the protective film and the optimal deposition conditions for the protective film.

OBJECTS AND SUMMARY

The present invention has been made to solve such problems, and has the technical merit of solving a problem that arises due to differences between the optimal deposition conditions for the magnetic film deposited before the protective film and the optimal deposition conditions for the protective film.

The present invention relates to a method for depositing a protective film on top of a magnetic film on a substrate, and wherein the protective film deposition temperature, which is the temperature of the substrate when the protective film is deposited, is higher than the magnetic film deposition temperature, which is the temperature of the substrate when the magnetic film is deposited, and the substrate is heated to the protective film deposition temperature when the protective film is deposited after the magnetic film has been deposited.

The present invention also relates to an apparatus for depositing a thin film on top of a magnetic film on a substrate, and the protective film deposition temperature, which is the temperature of the substrate when the protective film is deposited, is higher than the magnetic film deposition temperature, which is the temperature of the substrate when the magnetic film is deposited, and is equipped with a heating mechanism whereby the substrate is heated to the protective film deposition temperature when the protective film is deposited after the magnetic film has been deposited.

The above-mentioned apparatus may also be provided with an intermediate heating chamber which is equipped with the heating mechanism. This intermediate heating chamber may be provided between a magnetic film deposition chamber in which a magnetic film is deposited on the surface of the substrate, and a protective film deposition chamber in which a protective film is deposited and laminated on top of this magnetic film, and airtight connections may be made between the magnetic film deposition chamber and intermediate heating chamber and between the intermediate heating chamber and the protective film deposition chamber, whereby the magnetic film deposition, intermediate heating and protective film deposition can be performed successively without exposing the substrate to the atmosphere.

Alternatively, the protective film deposition chamber of the above-mentioned apparatus may deposit a protective film by plasma chemical vapor deposition and may be equipped with a biasing mechanism that applies a high frequency voltage to the substrate whereby a negative bias voltage is conferred to the substrate through the interaction between the high frequency and the plasma, causing positive ions in the plasma to impinge on the substrate.

Or, the protective film deposition chamber of the above-mentioned apparatus may be equipped with an ion source and may deposit a protective film by ion beam vapor deposition.

In addition, the protective film deposition chamber of the above-mentioned apparatus may be equipped with a plasma forming means that forms an electron cyclotron resonant plasma, and plasma chemical vapor deposition may be performed by the plasma formed by this plasma forming means.

DETAILED DESCRIPTION OF THE PREFERRED EMBODIMENTS

Figure 1:
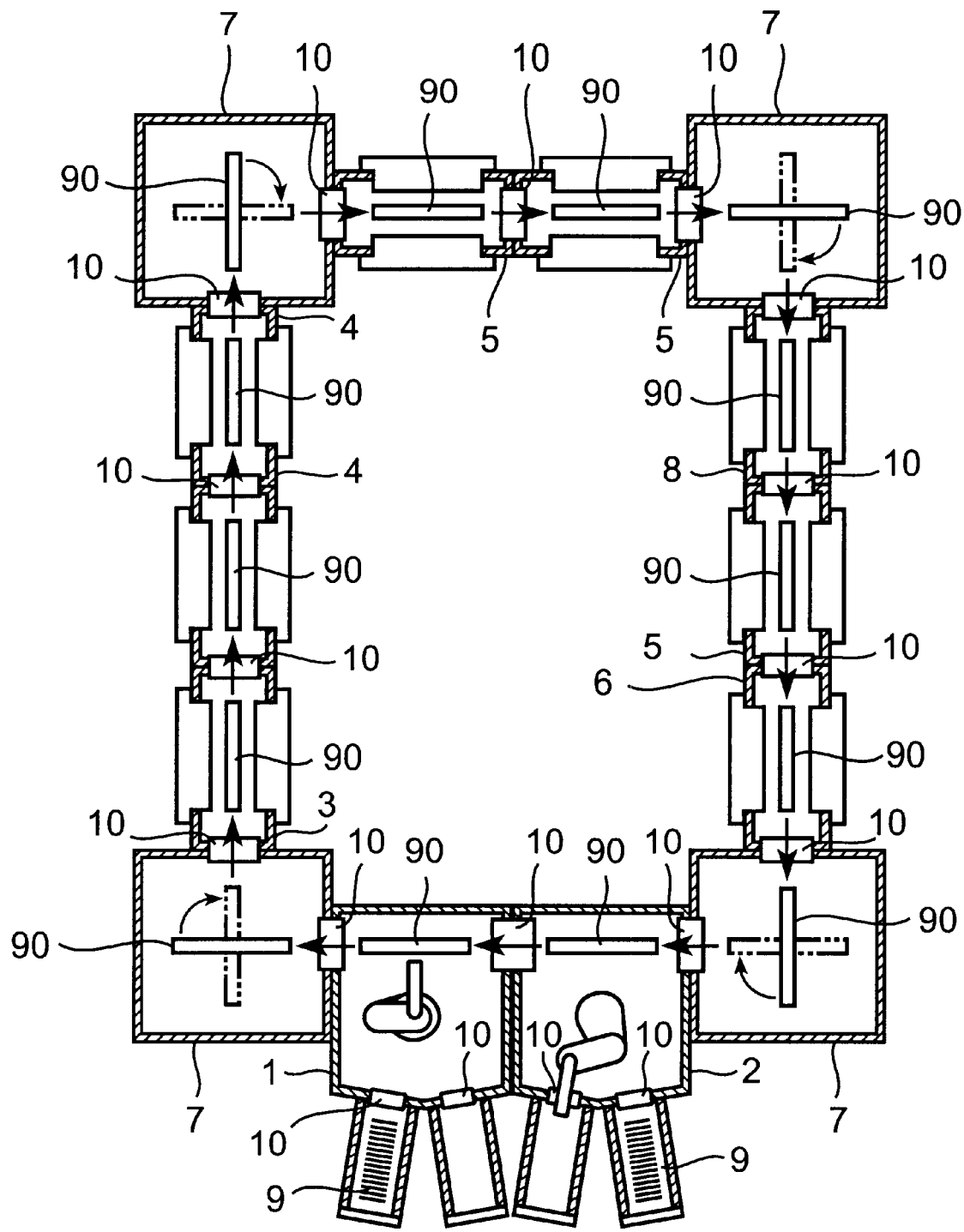
FIG. 1 is a plan view showing a schematic configuration of an apparatus for depositing a thin film on a data recording disk in one embodiment of the present invention.

FIG. 1 is a plan view showing a schematic configuration of an apparatus for depositing a thin film on a data recording disk relating in one embodiment of the present invention. The embodiment includes an in-line thin-film deposition apparatus. As used herein, "in-line" refers to an apparatus wherein a plurality of chambers are arranged in a row, and a substrate transfer path is routed through these chambers. In the apparatus of the present embodiment, a plurality of chambers 1, 2, 3, 4, 5, 6, 7 and 8 are arranged along a rectangular outline, along which a rectangular transfer path is set.

Chambers 1, 2, 3, 4, 5, 6, 7 and 8 are vacuum chambers which are pumped either individually or together by a pumping system or pumping systems. A gate valve 10 is provided at the boundary part of each chamber 1, 2, 3, 4, 5, 6, 7 and 8. A substrate 9 is mounted on a carrier 90 and transferred along the transfer path by a transport mechanism (not shown in FIG. 1).

Of the plurality of chambers 1, 2, 3, 4, 5, 6, 7 and 8, two chambers 1 and 2 are disposed on one side of the rectangle constitute load lock chamber 1 where substrate 9 is mounted on carrier 90, and unload lock chamber 2 where substrate 9 is recovered from carrier 90.

Also, the chambers 3, 4, 5, 6 and 8 are disposed along the other three sides of the rectangle and constitute process chambers where various processes are performed. These chambers 3, 4, 5, 6 and 8 include a preheating chamber 3 where substrate 9 is preheated before the thin film deposition, a foundation film deposition chamber 4 where a foundation film is deposited on the preheated substrate 9, a magnetic film deposition chamber 5 where a magnetic film is deposited on the foundation film which has been deposited on the substrate 9, an intermediate heating chamber 8 where the substrate 9 on which the magnetic film has been deposited is heated, and a protective film deposition chamber 6 where a protective film is deposited on the magnetic film on the heated substrate 9. Also, the chambers 7 at the corners of the rectangle constitute direction-changing chambers which are equipped with direction-changing mechanisms that change the transfer direction of substrate 9 through 90°.

Preheating chamber 3 is a chamber in which substrate 9 is heated to a prescribed temperature prior to film deposition. The temperature at which substrate 9 is to be held during film deposition is often greater than the chamber temperature, so substrate 9 is heated in preheating chamber 3 so that it is at the prescribed temperature when it arrives at foundation film deposition chamber 4, or the like. Another purpose for heating is to perform degassing, i.e., releasing occluded gas.

Figure 2:
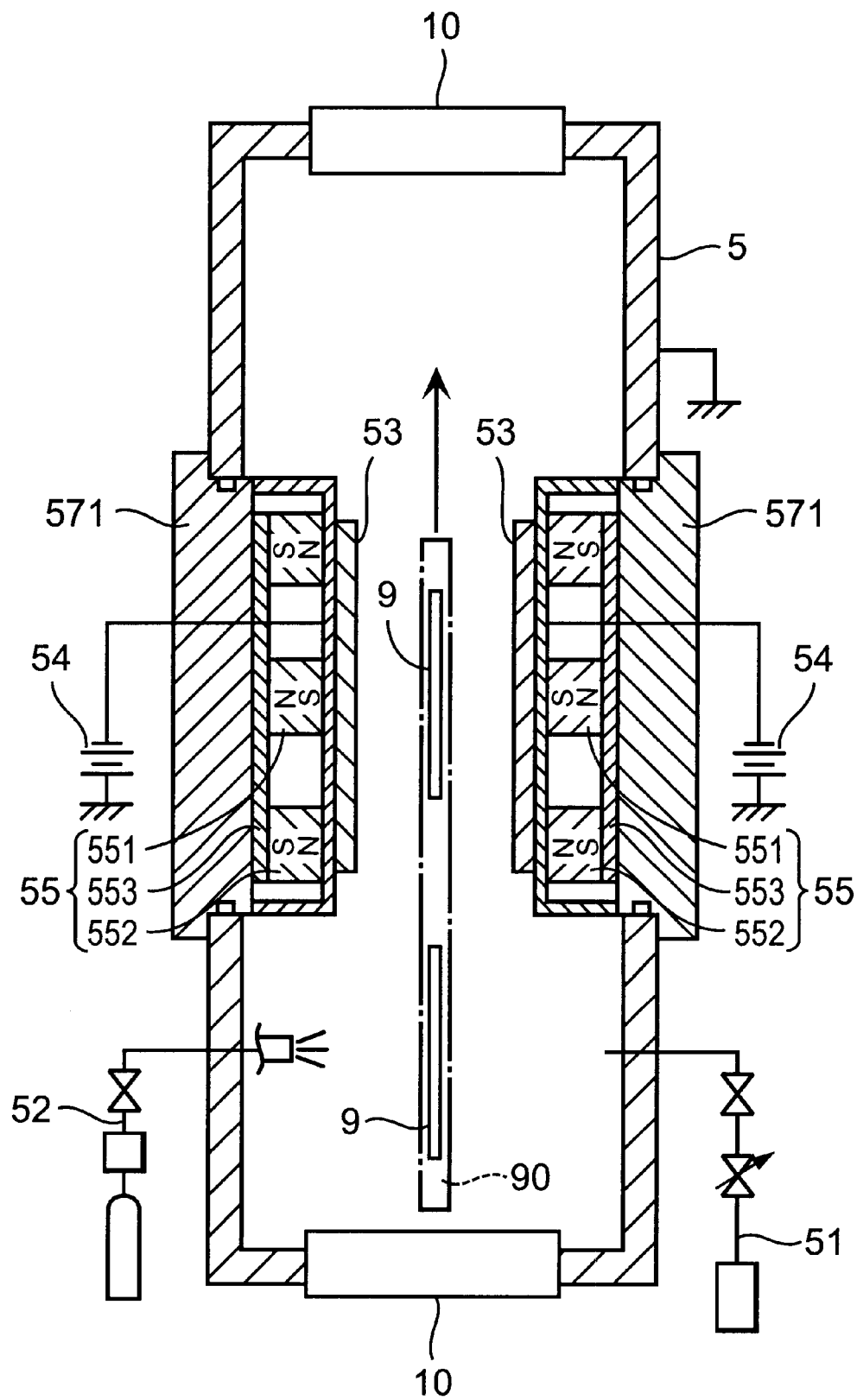
FIG. 2 is a schematic cross-sectional plan view illustrating the configuration of a magnetic film deposition chamber.

Foundation film deposition chamber 4 and magnetic film deposition chamber 5 may both use sputtering to deposit the foundation film and the magnetic film, respectively. The configuration of the two chambers differs only in terms of the target material, and the other parts of their configuration are basically the same. As an example, FIG. 2 is used to describe the configuration of magnetic film deposition chamber 5. FIG. 2 is a schematic cross-sectional plan view illustrating the configuration of magnetic film deposition chamber 5.

Magnetic film deposition chamber 5 principally includes a pumping system that pumps the interior of the chamber, a gas feed system 52 which introduces process gas into the interior of the chamber, a target 53 which is provided with its sputtered surface exposed to the space inside the chamber, a sputtering power source 54 which applies a sputter discharge voltage to target 53, and a magnet mechanism 55 which is provided behind target 53.

Pumping system 51 is equipped with a vacuum pump such as a cryo-pump, and is configured with the ability to pump the interior of magnetic film deposition chamber 5 down to $10^{-6}$ Pa or thereabouts. Gas feed system 52 is configured so as to introduce a gas such as argon at a prescribed flow rate as the process gas (the gas used for processing).

Sputtering power source 54 is configured so as to apply a high voltage of −300V to −600V or thereabouts to target 53. The purpose of magnet mechanism 55 is to achieve a magnetron discharge, and it includes a core magnet 551, an annular peripheral magnet 552 which surrounds this core magnet 551, and a planar yoke 553 which connects core magnet 551 with peripheral magnet 552. The target 53 and the magnet assembly 55 are preferably fixed to the magnetic film deposition chamber 5 via an insulating block 571. Also, magnetic film deposition chamber 5 is electrically grounded.

The interior of magnetic film deposition chamber 5 is held at a prescribed pressure by pumping system 51 while introducing process gas with gas feed system 52, and in this state, the sputtering power source 54 is operated. As a result, a sputter discharge is produced, target 53 is sputtered, and material sputtered from target 53 reaches substrate 9, whereby the prescribed magnetic film is deposited on the surface of substrate 9. For example, target 53 might be made of CoCrTa, whereby a film of CoCrTa is deposited on the surface of substrate 9.

In foundation film deposition chamber 4, Cr or an alloy of Cr, or the like, is used as the target material.

Furthermore, as can be seen from FIG. 2, the combination of target 53, magnet mechanism 55 and sputtering power source 54 is provided at both sides of the substrate placement position inside magnetic film deposition chamber 5, whereby a magnetic film can be deposited simultaneously on both sides of substrate 9.

The foundation film deposition chamber 4 can also be set up so that a foundation film can be deposited simultaneously on both sides of the substrate 9.

Also, as shown in FIG. 2, the size of each target 53 is preferably made slightly larger than the size of a single substrate 9, or thereabouts. Carrier 90 moves inside magnetic film deposition chamber 5, and two substrates 9 are sequentially positioned at the front of target 53. That is, the substrate 9 at the front in the transfer direction is first positioned in front of target 53, and film deposition is performed on this substrate 9 in this state. After that, the substrate 9 at the rear in the transfer direction is then positioned in front of target 53 by moving it a prescribed distance, and film deposition is performed on this substrate 9 in this state.

Figure 3:
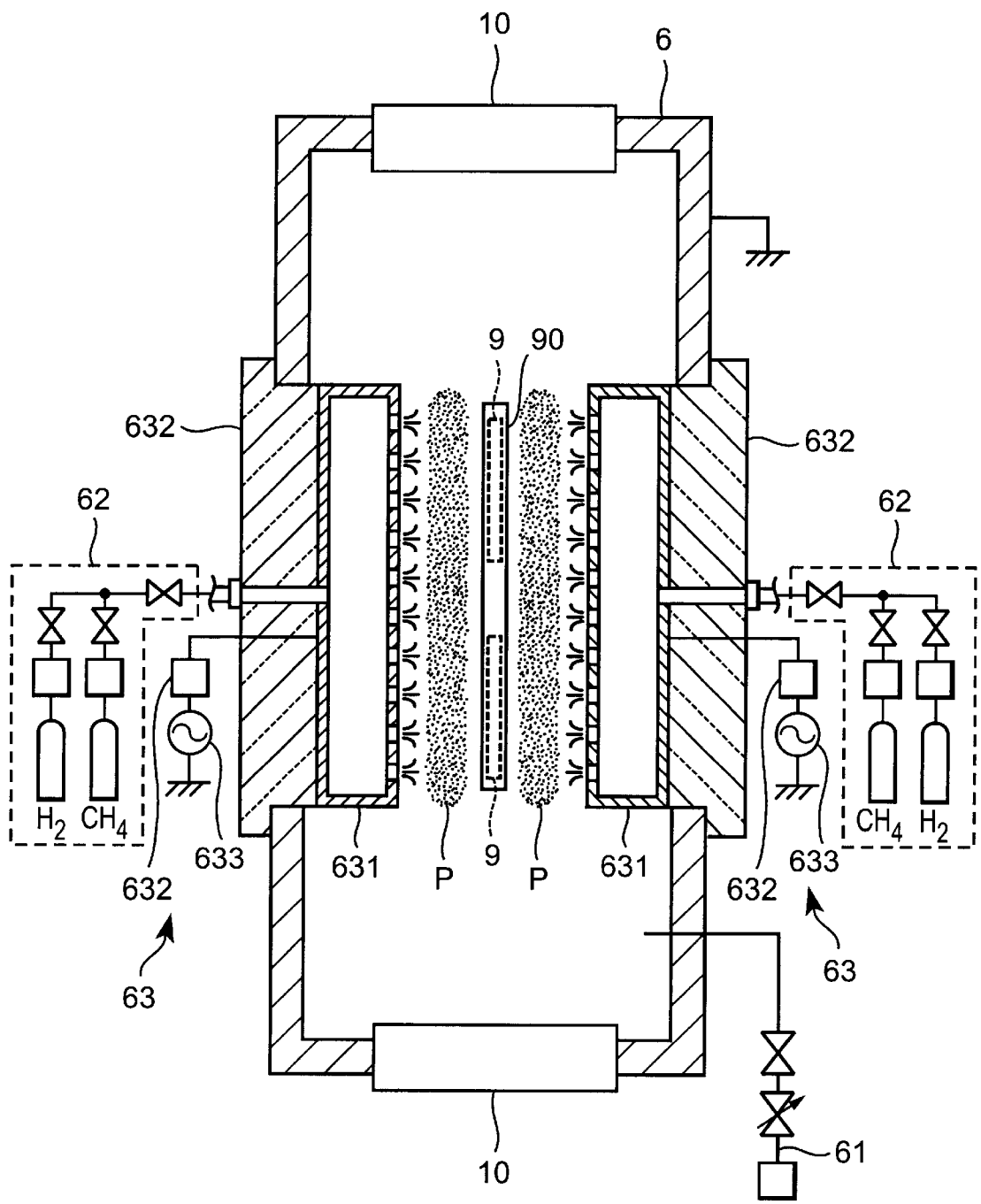
FIG. 3 is a schematic cross-sectional plan view showing a detailed view of a protective film deposition chamber of the apparatus shown in FIG. 1.
Figure 4:
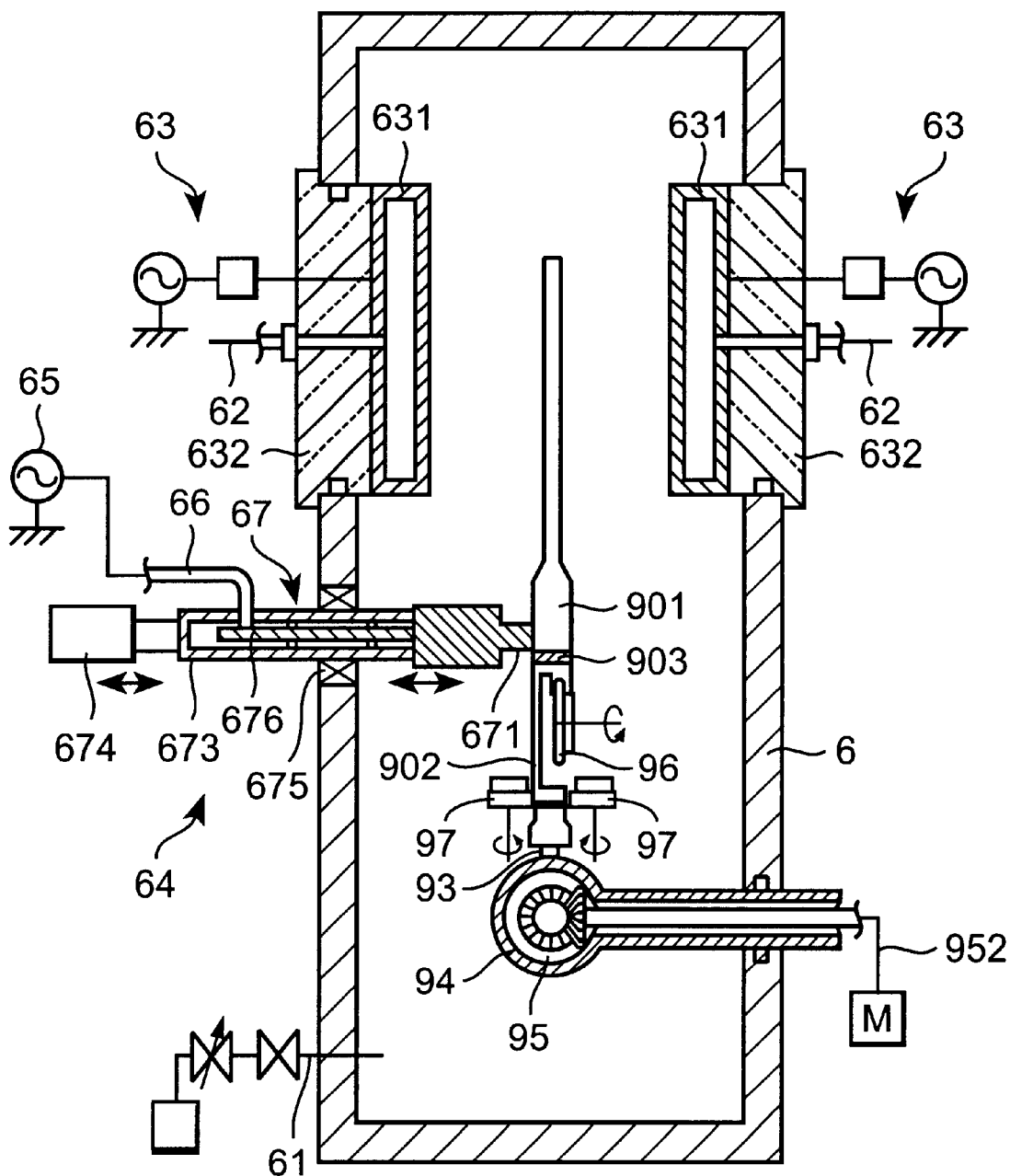
FIG. 4 is a schematic cross-sectional side view showing a detailed view of a protective film deposition chamber of the apparatus shown in FIG. 1.

FIGS. 3 and 4 illustrate protective film deposition chamber 6. FIGS. 3 and 4 are detailed views of the protective film deposition chamber shown in FIG. 1; FIG. 3 is a schematic cross-sectional plan view, and FIG. 4 is a schematic cross-sectional side view.

In the apparatus of the present embodiment, a protective film is deposited by plasma CVD. That is, protective film deposition chamber 6 is equipped with a pumping system 61 which pumps the interior of the chamber, a gas feed system 62 which introduces a process gas including a gas constituting the precursor material, and a plasma forming means 63 which forms a plasma by conferring energy to the introduced process gas.

Pumping system 61 is equipped with a vacuum pump such as a turbo-molecular pump and is configured with the ability to pump the interior of protective film deposition chamber 6 down to $10^{-4}$ Pa, or thereabouts. Gas feed system 62 is configured with the ability to introduce a mixed gas of $CH_4$ and $H_2$ as the process gas at a prescribed flow rate. Plasma forming means 63 is made to form a plasma by producing a high-frequency discharge in the introduced process gas.

Plasma forming means 63 principally includes a high frequency electrode 631 provided inside protective film deposition chamber 6, and a plasma high-frequency power source 633 which supplies high-frequency electrical power to high-frequency electrode 631 via a matching circuit 632. High-frequency electrode 631 is also used as a path whereby process gas is supplied to the interior of protective film deposition chamber 6. Specifically, high-frequency electrode 631 has a hollow shape and has a large number of uniformly distributed gas outlet holes in the surface facing the substrate 9 transferred into protective film deposition chamber 6. The duct of gas feed system 62 is connected to high-frequency electrode 631, and the gas introduced by gas feed system 62 collects within the space inside high-frequency electrode 631 for a time, after which it is ejected from the gas outlet holes.

Plasma high-frequency power source 633 is preferably made to supply high-frequency electrode 631 with high-frequency electrical power at a frequency of 13.56 MHZ and an output power of 700 W or thereabouts. Protective film deposition chamber 6 is electrically grounded. Also, high-frequency electrode 631 is provided in protective film deposition chamber 6 via an insulating member 634.

When gate valve 10 is closed after carrier 90 has been brought inside protective film deposition chamber 6, process gas is introduced into protective film deposition chamber 6. Pumping system 61 maintains the pressure inside protective film deposition chamber 6 at a prescribed value, and in this state a high-frequency voltage is applied to high-frequency electrode 631. In this way, a high-frequency electrical field is established in the space at the front of high-frequency electrode 631, and a high-frequency discharge is produced in the process gas. As a result, a plasma P is formed in the process gas. In plasma P, the $CH_4$ gas dissociates to produce carbon, and a thin film of carbon is deposited on the surface of substrate 9 as a protective film.

Also, protective film deposition chamber 6 is made capable of depositing films on the surfaces of both sides of substrate 9 in the same way as the above-mentioned magnetic film deposition chamber 5. Specifically, as shown in FIG. 3, the combination of gas feed system 62 and plasma forming means 63 is provided at both sides of the substrate placement position inside protective film deposition chamber 6, whereby a protective film can be deposited simultaneously on both sides of substrate 9.

An intermediate heating chamber 8 is separate from preheating chamber 3 and is provided between magnetic film deposition chamber 5 and protective film deposition chamber 6. That is, a configuration is employed in which substrate 9 is heated after the magnetic film has been deposited and before the protective film is deposited. This configuration is based on the results of research regarding the protective film deposition conditions and magnetic film deposition conditions.

Figure 5:
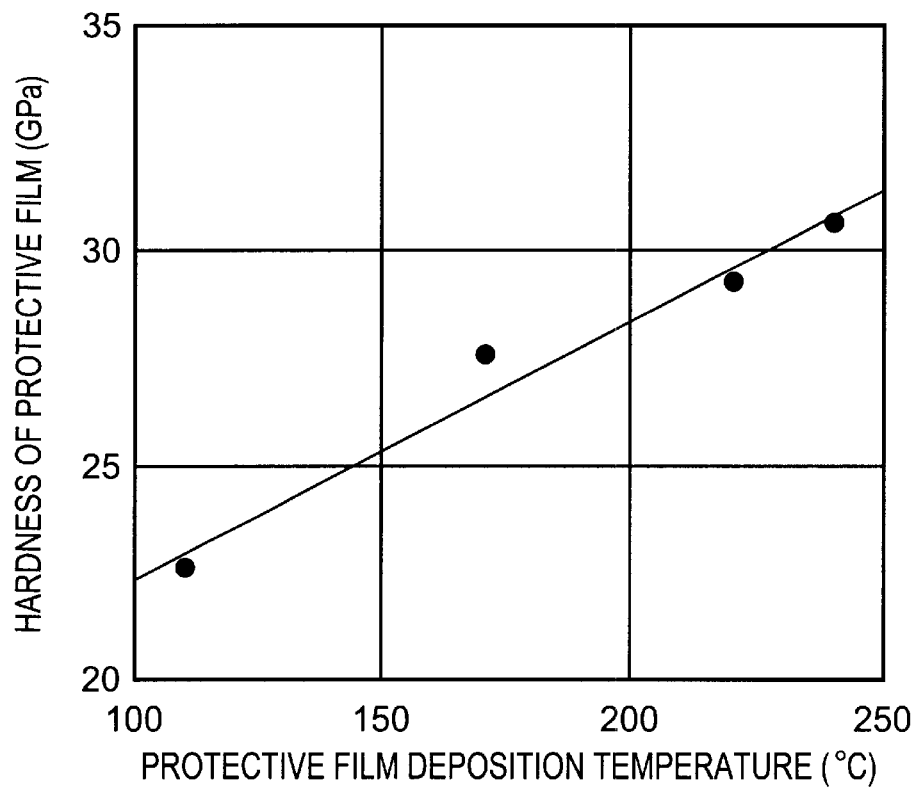
FIG. 5 is a figure showing the results of tests to study the relationship between the protective film deposition temperature and the hardness of the protective film.

Having made a study of the relationship between the protective film hardness and the protective film deposition conditions, it was found that the hardness of the protective film is highly dependent on the temperature of substrate 9 when the protective film is deposited (referred to as the protective film deposition temperature in the following). FIG. 5 shows the results of tests to study the relationship between the protective film deposition temperature and the hardness of the protective film. In these tests, the protective film was deposited under the following conditions:

Pressure inside protective film deposition chamber: 4 Pa

Process gas: Mixed gas of $CH_4$ and $H_2$

Process gas flow rate: $CH_4$ 100 cc/minute, $H_2$ 100 cc/minute

Plasma high-frequency power source: 13.56 MHZ, output power 700 W

Film deposition tests were performed by depositing protective films under the above conditions while varying the protective film deposition temperature. Accordingly, the horizontal axis in FIG. 5 shows the protective film deposition temperature. Also, the vertical axis in FIG. 5 shows the hardness of the protective film (GPa, gigapascals).

As can be seen from FIG. 5, the hardness of the protective film increases substantially linearly as the protective film deposition temperature increases. That is, a higher protective film deposition temperature results in a protective film of greater hardness. To obtain a hardness of at least 30 GPa, which is generally required of protective films of this sort, it can be seen from FIG. 5 that a protective film deposition temperature of at least 230° C. is required, under the aforementioned conditions.

This dependency of the protective film hardness on the protective film deposition temperature is considered to originate from the energy available during deposition of the carbon thin film. When the above-mentioned $CH_4$ dissociates in the plasma and carbon accumulates on the surface of substrate 9, it is considered that when the energy is low, the C—H bonds are not completely broken and the carbon thin film is deposited with large numbers of intact C—H bonds. Also, when the energy is low, it is considered that the crystallization resulting from carbon-carbon bonding results in a greater proportion of hexagonal close-packed structure, which is the crystalline structure of graphite, than face-centered cubic, which is the crystalline structure of diamond. If the temperature of substrate 9 is high and a large amount of energy is received from substrate 9 during deposition of the carbon this film, the proportion of face-centered cubic crystalline structures increases. As a result, it is considered that the hardness increases.

Research has also been conducted into the relationship between the magnetic properties of the magnetic film and the magnetic film deposition conditions. In a magnetic film for a data recording disk at which the present invention is directed, the coercive field strength is an essential magnetic characteristic in terms of the stability, reliability, and the like, of data recordings. Therefore, the relationship between the temperature of substrate 9 during magnetic film deposition (referred to as the magnetic film deposition temperature in the following) and the coercive field strength of the magnetic film has been studied.

Figure 6:
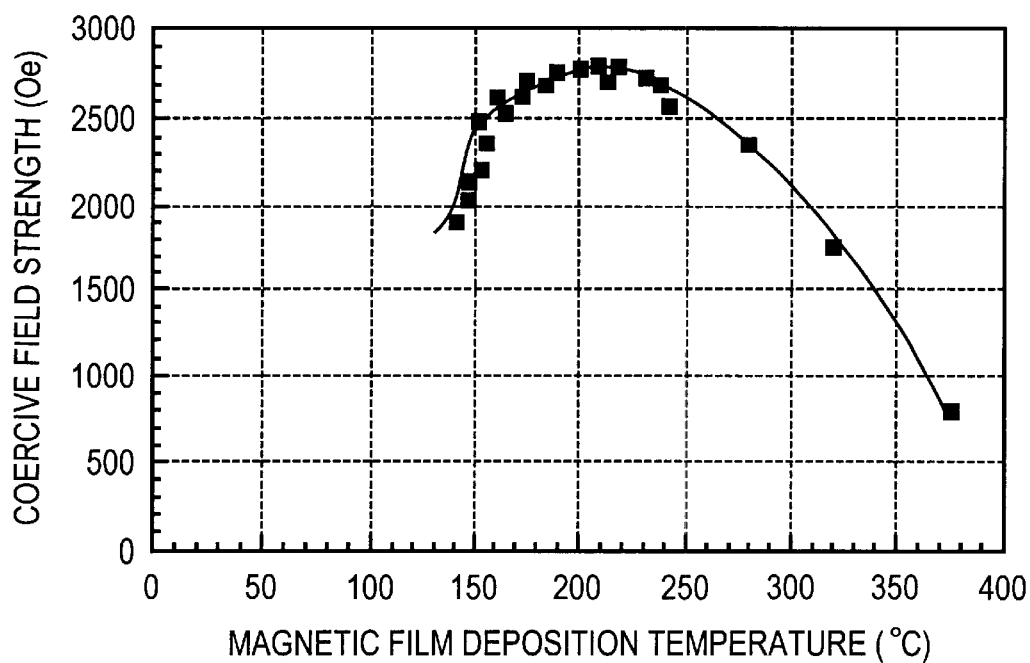
FIG. 6 is a figure showing the results of tests to study the relationship between the magnetic film deposition temperature and the coercive field strength of the magnetic film.

FIG. 6 shows the results of tests to investigate the relationship between the magnetic film deposition temperature and the coercive field strength of the magnetic film. In these tests, magnetic film deposition was performed under the following conditions:

Target material: CoCrTa

Pressure inside magnetic film deposition chamber: 0.67 Pa

Process gas: Argon

Process gas flow rate: 100 cc/minute

Voltage and power of sputtering power source: −400 V, 900 W

Film deposition tests were performed by depositing magnetic films made of CoCrTa under the above conditions while varying the magnetic film deposition temperature. The horizontal axis in FIG. 6 shows the magnetic film deposition temperature, and the vertical axis in FIG. 6 shows the coercive field strength of the magnetic film (Oe).

As can be seen from FIG. 6, under the foregoing conditions, the coercive field strength of the magnetic film increases as the magnetic film deposition temperature increases, but conversely it tends to decrease after reaching a peak at a certain limit. In the example shown in FIG. 6, the temperature at which the coercive field strength reaches its peak is about 230° C. This means that the magnetic film deposition temperatures that bring about a high coercive field strength are limited to a certain temperature range. The reason for this is not entirely clear, but it is thought to originate from the crystalline structure. Specifically, it is conjectured that there is a certain type of crystalline structure that confers coercive field strength, and that at temperatures less than or greater than the peak, the formed crystalline structure is different than the certain type and the coercive field strength decreases.

The magnetic film deposition temperature that confers the peak coercive field strength is lower than the protective film deposition temperature that brings about the hardness of 30 GPa that is generally required. The results of the research show that it may not be possible to simultaneously achieve a high coercive field strength in the magnetic film and a high hardness on the protective film unless the protective film deposition temperature is made higher than the magnetic film deposition temperature. According to the research, a similar trend is exhibited by magnetic films made of many other materials, and it has been found that a high coercive field strength may not be obtained unless the magnetic film is deposited at a lower temperature than the protective film deposition temperature used to confer high hardness.

In the apparatus of the present embodiment, a separate intermediate heating chamber 8 is interspersed between magnetic film deposition chamber 5 and protective film deposition chamber 6, and a preheating step is performed prior to deposition of the protective film.

Figure 7:
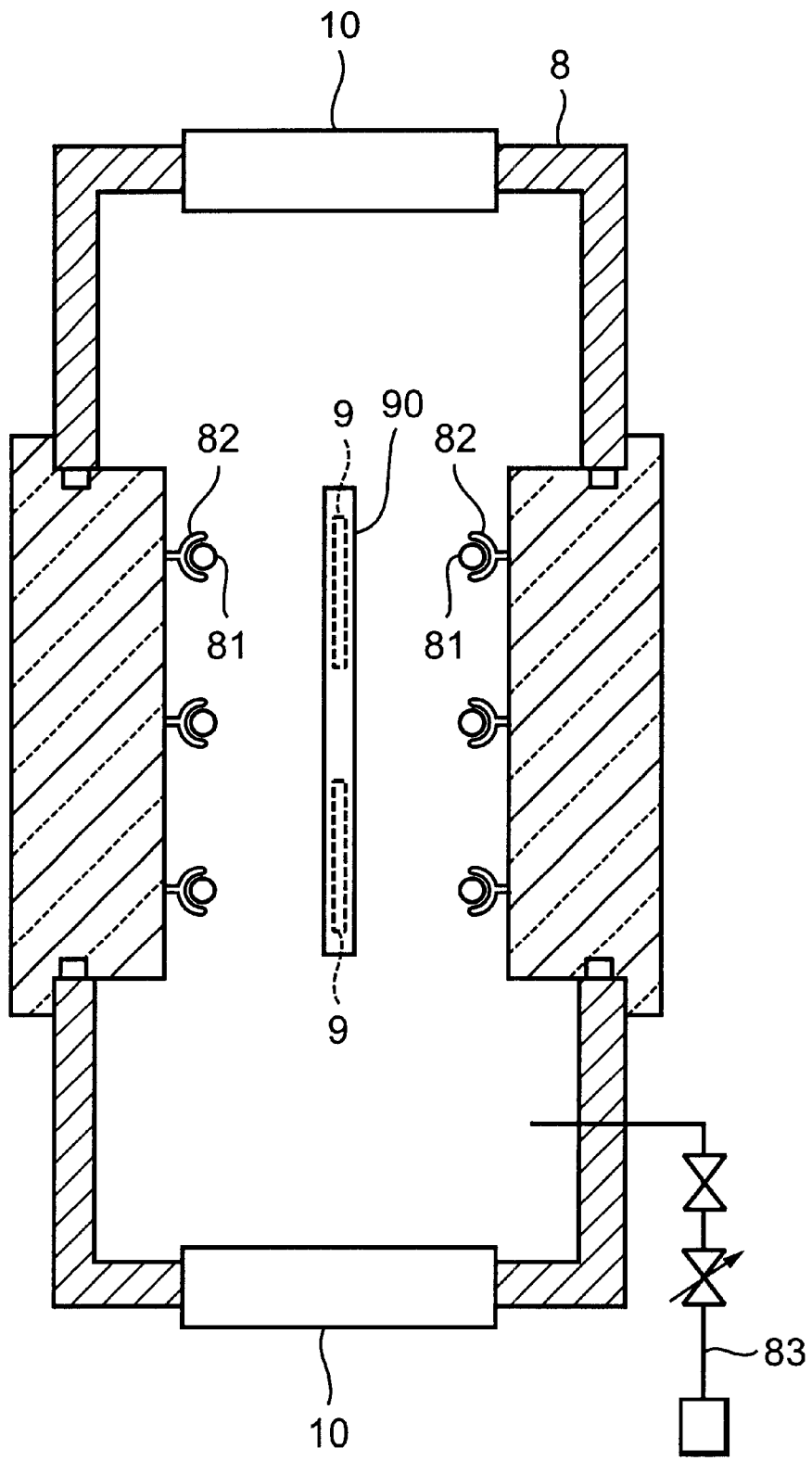
FIG. 7 is a schematic cross-sectional plan view showing the configuration of an intermediate heating chamber.

The intermediate heating chamber 8 of the present embodiment is described in specific detail with reference to FIG. 7. FIG. 7 is a schematic cross-sectional plan view showing the configuration of intermediate heating chamber 8. The intermediate heating chamber 8 in the present embodiment heats substrate 9 by radiative heating. Specifically, a plurality of radiative heating lamps 81 are provided inside intermediate heating chamber 8 as a heating mechanism. Radiative heating lamps 81 could be a bar-type infra-red lamp for example, and are equipped with a reflecting mirror 82 to the rear thereof. The plurality of radiative heating lamps 81 are provided within a plane parallel to substrate 9. The plurality of radiative heating lamps 81 are disposed in such a way that it is possible to heat substrate 9 uniformly. Note that the seal of radiative heating lamp 81 is formed from a material such as quartz glass to prevent contamination of substrate 9.

The temperature to which substrate 9 is heated by radiative heating lamps 81 depends on the protective film deposition temperature in protective film deposition chamber 6 as can be understood from the above description. For example, when the protective film deposition temperature is 240° C., substrate 9 is heated to 240° C. or a slightly higher temperature. Heating to a slightly higher temperature (e.g. 250° C.) takes into account the drop in temperature that occurs when substrate 9 is transferred from intermediate heating chamber 8 to protective film deposition chamber 6.

In the above example, radiative heating lamps 81 were used as the heating mechanism, but it is also possible to employ a configuration in which the substrate 9 is heated by a laser. When a laser is used, a scanning mechanism is provided to scan the laser over the surface of substrate 9. It is also possible to employ a configuration in which a carbon heater (a heater such as a resistive heat-emitting type using a carbon element) is used.

Furthermore, it is possible to employ a heating mechanism that heats the substrate by conduction. For example, a heating block could be provided in such a way that it comes into contact with carrier 90, and a resistive heat-emitting heater could be provided inside this heating block. Carrier 90 is then made so as to make contact with substrate 9 over as great a region as possible around the edge of substrate 9. However, in this configuration the heating block has to be separated from the carrier when carrier 90 is moved, so a mechanism for moving the heating block is required. Consequently, this approach has the disadvantage of added mechanical complexity. Also, when film deposition is performed on both sides of the substrate it is only possible to make contact with the outer edge of substrate 9, so the heating efficiency is poor. A configuration that uses radiative heating by means such as a lamp or laser is therefore superior in that it does not suffer from these drawbacks.

Intermediate heating chamber 8 is equipped with a pumping system 83 which pumps the interior thereof. Pumping system 83 is configured from a vacuum pump such as a turbo-molecular pump or cryo-pump, and is made capable of pumping the interior of intermediate pumping chamber 8 down to $10^{-6}$ Pa or thereabouts. By pumping the interior of intermediate heating chamber 8 with pumping system 83, the thin films deposited on substrate 9 are prevented from being contaminated with oxides or the like when they are heated. To prevent contamination with oxides or the like, an inert gas such as nitrogen could be introduced to perform substitution.

To heat substrate 9 after the magnetic film deposition and before the protective film deposition, one might also consider a configuration wherein a heating means is provided inside protective film deposition chamber 6, instead of the configuration in which a dedicated intermediate heating chamber 8 is provided as in the present embodiment. For example, one might provide a radiative heating lamp inside protective film deposition chamber 6 and use this radiative heating lamp to heat substrate 9 to the prescribed temperature before a plasma is formed and the protective film is deposited.

However, a configuration such as this has the drawback that the overall time taken for processing inside protective film deposition chamber 6 is long. Deposition of a protective film by plasma CVD tends to take longer than the deposition of a foundation film or magnetic film by sputtering, and protective film deposition chamber 6 is often the chamber that governs the tact time of the apparatus as a whole. Accordingly, if the time required for intermediate heating is added to this, the tact time becomes even longer, and the productivity of the apparatus is greatly impaired. Note that the "tact time" is the time between the removal of a processed substrate 9 from one carrier 90 and the removal of a processed substrate 9 from the next carrier 90. At every tact time, each carrier 90 moves to the next chamber.

Also, when a radiative heating lamp is provided inside protective film deposition chamber 6, a problem arises in that a thin film is gradually deposited on the lamp and the radiation from the lamp is blocked out. Consequently, there is a problem in that it is necessary to perform work such as removing the deposited thin film or replacing the lamp, which may involve a large amount of labor and expenditure.

On the other hand, when an exclusive intermediate heating chamber 8 is provided as in the present embodiment, the above-mentioned problem of increased tact time does not arise and there is essentially no decrease in the productivity of the apparatus. Moreover, since there are essentially no chemical species capable of depositing a thin film in intermediate chamber 8, no problems arise as a result of film deposition on radiative heating lamps 81. And since intermediate heating chamber 8 is provided with airtight seals between magnetic film deposition chamber 5 and protective film deposition chamber 6, it is possible for the steps of magnetic film deposition, intermediate heating and protective film deposition to be implemented without exposing substrate 9 to the atmosphere. Consequently, there are also no problems of reduced quality in the magnetic film or protective film.

Another feature of the present embodiment of the present invention is described next.

Figure 8:
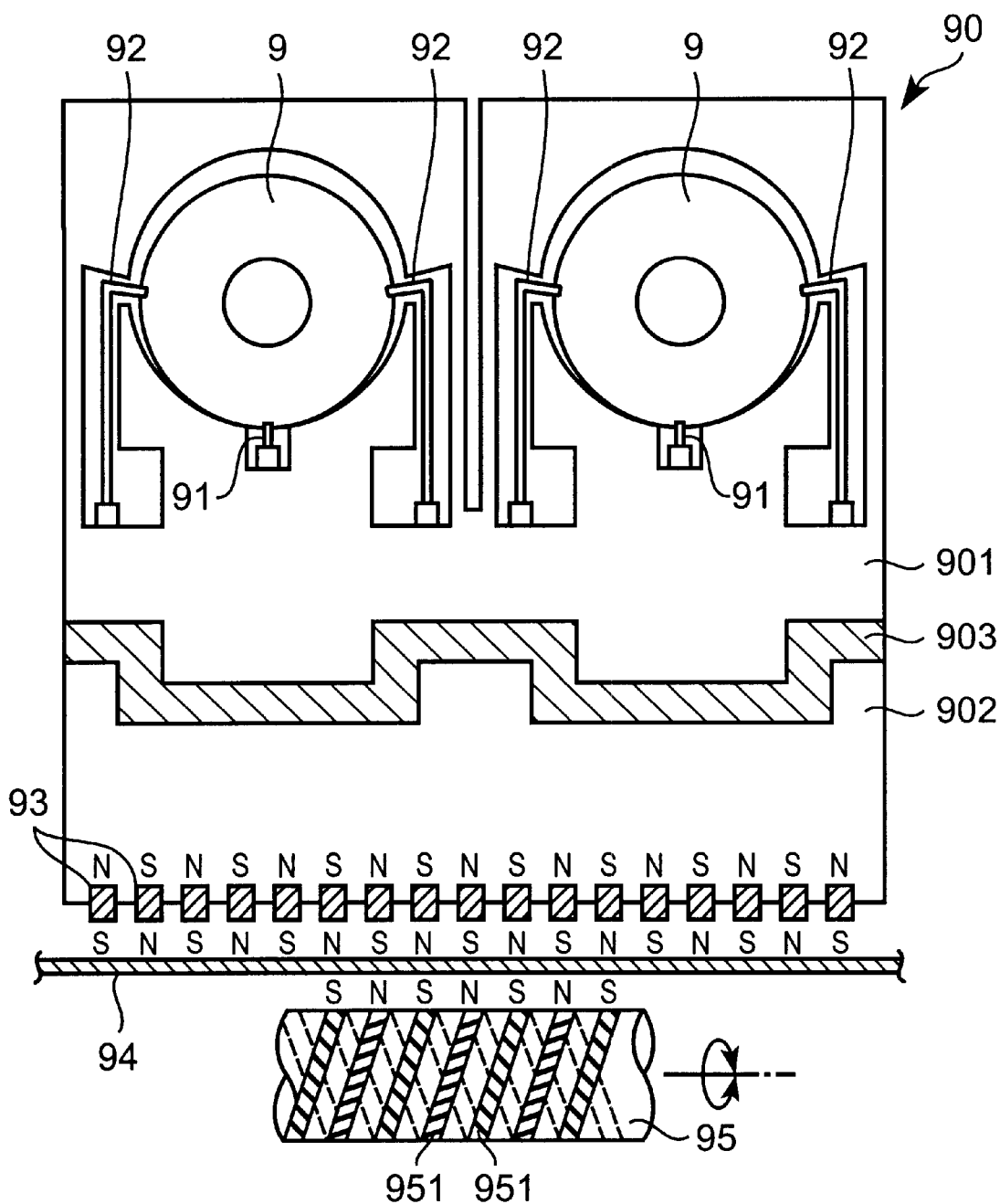
FIG. 8 is a front view illustrating the configuration of a transfer mechanism that transfers a carrier and a substrate carried on the carrier.

FIG. 8 is a front view showing the configuration of a transfer mechanism that transfers a carrier 90 and a substrate 9 carried on carrier 90. Carrier 90 has a planar shape overall, and comprises an upper part 901 and lower part 902 with an insulating material 903 sandwiched between them. Upper part 901 is formed of a metal such as stainless steel or aluminum. Carrier 90 has two more or less circular holes that are larger than the diameter of substrate 9. Retaining claws 91 and 92 which support substrate 9 are provided at the bottom edge and at the left and right side edges of each hole. Retaining claws 91 and 92 are formed of a metal such as stainless steel like upper part 901.

A large number of small magnets (referred to as carrier-side magnets in the following) 93 are provided at the bottom edge of carrier 90. Carrier-side magnets 93 are arranged with alternating magnetic poles. Also, as shown in FIG. 8, a magnetically coupled roller 95 is provided below carrier 90 and separated therefrom by a gap 94. Magnetically coupled roller 95 has a magnet train 951 in the form of a double helix. Each magnet train 951 is partitioned into small magnets (referred to as roller-side magnets in the following). As FIG. 8 shows, each roller-side magnet of magnet train 951 is magnetically coupled with the carrier-side magnets 93 above it.

A rotary mechanism 952 is provided in magnetically coupled roller 95. When magnetically coupled roller 95 is rotated by rotary mechanism 952, carrier 90 moves in the horizontal direction (along the axial direction of magnetically coupled roller 95). In this way, the substrate 9 mounted on carrier 90 is transported.

As shown in FIG. 4, the above-mentioned carrier 90 is mounted on main rollers 96 which rotate around horizontal rotary shafts, and the bottom end thereof makes contact with secondary rollers 97 which rotate around vertical rotary shafts. When the above-mentioned transfer mechanism is operated, carrier 90 moves while being guided by main rollers 96 and secondary rollers 97.

Another feature of the present embodiment is that the protective film deposition chamber 6 is equipped with a biasing mechanism 64 that applies a negative bias voltage to substrate 9 when a protective film of carbon is deposited by plasma CVD, causing ions in the plasma to impinge on substrate 9. This feature is described with reference to FIG. 4. As FIG. 4 shows, biasing mechanism 64 includes a high-frequency biasing power source 65 which generates a prescribed high frequency, a high frequency line 66 that connects high-frequency biasing power source 65 to carrier 90, and a variable contact 67 which is provided at the tip of high frequency line 66.

High-frequency biasing power source 65 produces a frequency of 13.56 MHZ and an output power of 1000 W or thereabouts. A coaxial cable or the like is used for high frequency line 66. A matching circuit (not illustrated) is provided in high frequency line 66.

Variable contact 67 is principally configured from an electrode rod 671 whose tip contacts the upper part 901 of carrier 90, an electrode drive rod 673 which has electrode rod 671 attached to the tip thereof via an intervening insulator, and an electrode drive source 674 which drives electrode drive rod 673.

Electrode drive rod 673 passes through to the interior of protective film deposition chamber 6 while maintaining an airtight seal with a vacuum seal 675 such as a mechanical seal using a magnetic fluid which is interspersed between the two. Electrode rod 671 is connected to high frequency line 66 via a high frequency feed rod 676 inside electrode drive rod 673. High frequency feed rod 676 and electrode drive rod 673 are insulated. An air cylinder might for example be used for electrode drive source 674, whereby electrode drive rod 673 is driven forwards and backwards with a prescribed stroke.

When carrier 90 is brought inside protective film deposition chamber 6 and stopped at a prescribed position, electrode drive source 674 operates and electrode drive rod 673 is moved forward by a prescribed stroke distance. As a result, electrode rod 671 also moves forward, and the tip of electrode rod 671 contacts the upper part 901 of carrier 90 as shown in FIG. 4. As a result, a high frequency voltage is applied to substrate 9 via upper part 901. Since lower part 902 of carrier 90 is insulated by insulating material 903, the high frequency voltage is not applied to main rollers 96 or the like.

In the state where a plasma P is formed as shown in FIG. 3, the application of a high frequency voltage to substrate 9 gives rise to a negative bias voltage (self-bias voltage) at the surface of substrate 9 due to the difference between the mobility of ions in electrons in plasma P. This negative bias voltage causes ions in plasma P to impinge on and collide with the surface of substrate 9 with high efficiency. Consequently, a thin carbon film is deposited on the surface of substrate 9 while receiving energy by ion collisions from the incident ions. As a result, the crystalline structure of the deposited carbon thin film has an increased proportion of diamond structure, and a favorable DLC film with a high level of hardness is obtained.

Next, the operation of the present invention is described along with the action of the apparatus of the present embodiment.

First, two unprocessed substrates 9 are mounted on the first carrier 90 inside load lock chamber 1. This carrier 90 moves into preheating chamber 3 where the substrates 9 are preheated. Meanwhile, two more unprocessed substrates 9 are mounted on the next carrier 90. After one tact time has elapsed, carrier 90 moves into foundation film deposition chamber 4 and a foundation film is deposited on substrates 9. Meanwhile, the next carrier 90 moves into preheating chamber 3 where the substrates 9 are preheated, and more substrates 9 are mounted on another carrier 90 inside load lock chamber 1.

In this way, by moving the carriers 90 at every tact time, the processes of preheating, deposition of a foundation film, deposition of a magnetic film, intermediate heating and deposition of a protective film are performed sequentially. After the protective film has been deposited, carrier 90 reaches unload lock chamber 2 where the two processed substrates 9 are retrieved from this carrier 90. In the present embodiment, two foundation film deposition chambers 4 are provided. Accordingly, one half of the thickness is deposited in the first foundation film deposition chamber 4, and the other half of the thickness is deposited in the next foundation film deposition chamber. Magnetic film deposition chamber 5 and protective film deposition chamber 6 are also doubled up in the same way.

In the above-mentioned operations, the deposition temperature of the magnetic film is roughly 150° C. to 250° C. After a magnetic film has been deposited on a substrate 9, the substrate is preheated to roughly 200 to 300° C. in intermediate heating chamber 8 as described above. After that, the substrate is transferred into protective film deposition chamber 6 where a protective film consisting of a thin carbon film (referred to as a carbon protective film in the following) is deposited. Consequently, a structure is obtained in which a carbon protective film with a high level of hardness is deposited on top of a magnetic film with a high coercive field strength. Accordingly, the apparatus of the present embodiment can contribute to the construction of high-performance magnetic recording media.

Another embodiment of the invention of the present application is described next.

Figure 9:
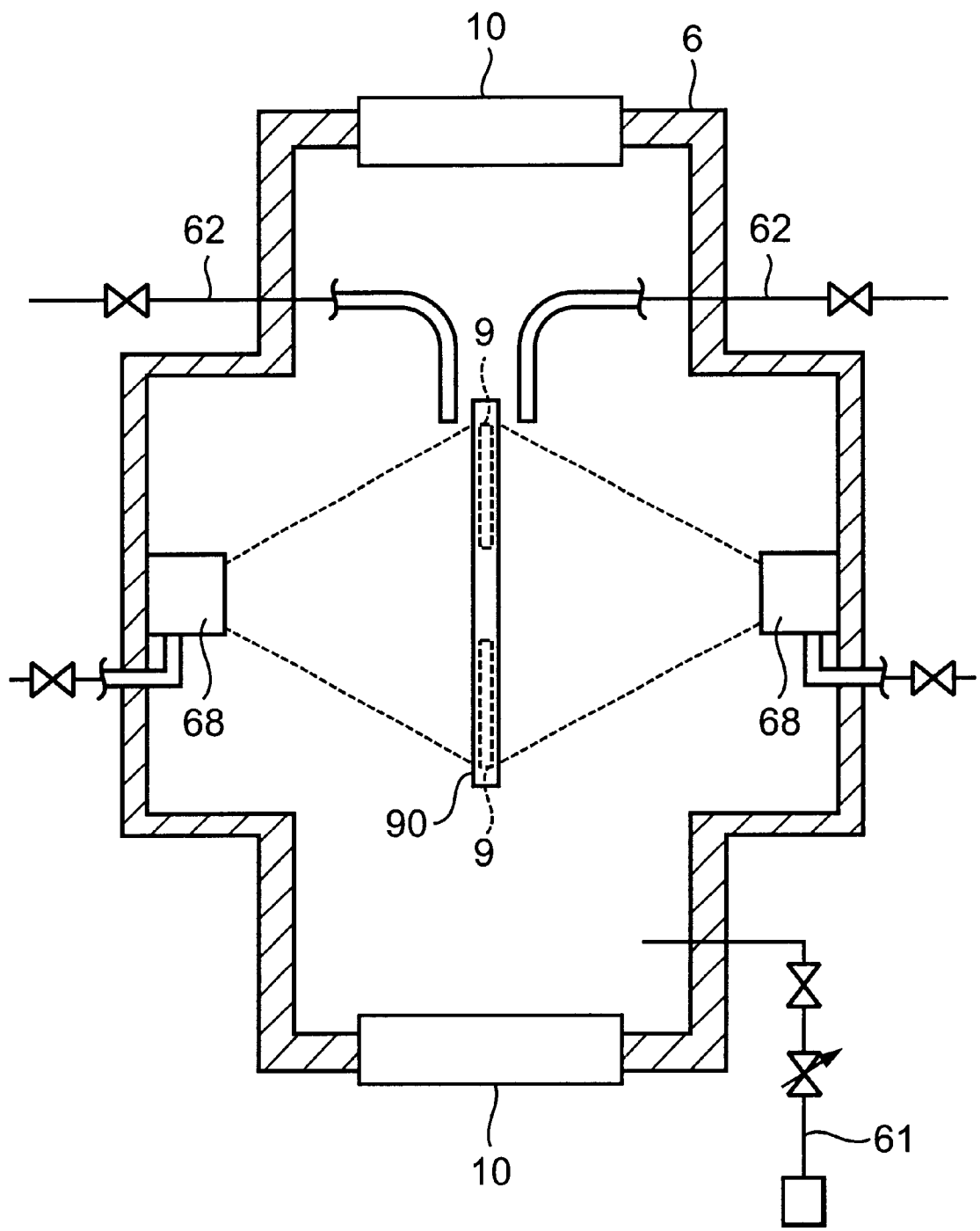
FIG. 9 is a schematic cross-sectional plan view showing the configuration of another embodiment of the present invention wherein the protective film deposition chamber deposits a protective film by ion beam vapor deposition.

FIG. 9 is a schematic cross-sectional plan view showing the configuration of another embodiment of the invention of the present application wherein protective film deposition chamber 206 deposits a protective film by ion beam vapor deposition. The embodiment shown in FIG. 9 is equipped with a gas feed system 262 which introduces a process gas including a precursor gas such as $CH_4$, and an ion source 268 which dissociates the process gas to supply ions which generate carbon.

As can be seen from FIG. 9, gas feed system 262 introduces the process gas to the vicinity of the surface of substrate 9. Ion source 268 supplies a sufficient quantity of ions such as oxygen, nitrogen or hydrogen to the process gas. If necessary, other parts such as an accelerating electrode to accelerate the ions and a deflector to change the direction of the ion stream may also be provided. The process gas mixes with the ions near the surface of substrate 9 and dissociates, whereby a carbon protective film is deposited on the surface of substrate 9.

It is also possible to employ a type of ion beam vapor deposition in which film deposition is performed by directly ionizing a precursor gas. In this case, a precursor gas ion beam of $CH_4$, $C_2H_2$ or the like is directed at the surface of substrate 9 by an ion source 268, thereby depositing a carbon protective film.

Figure 10:
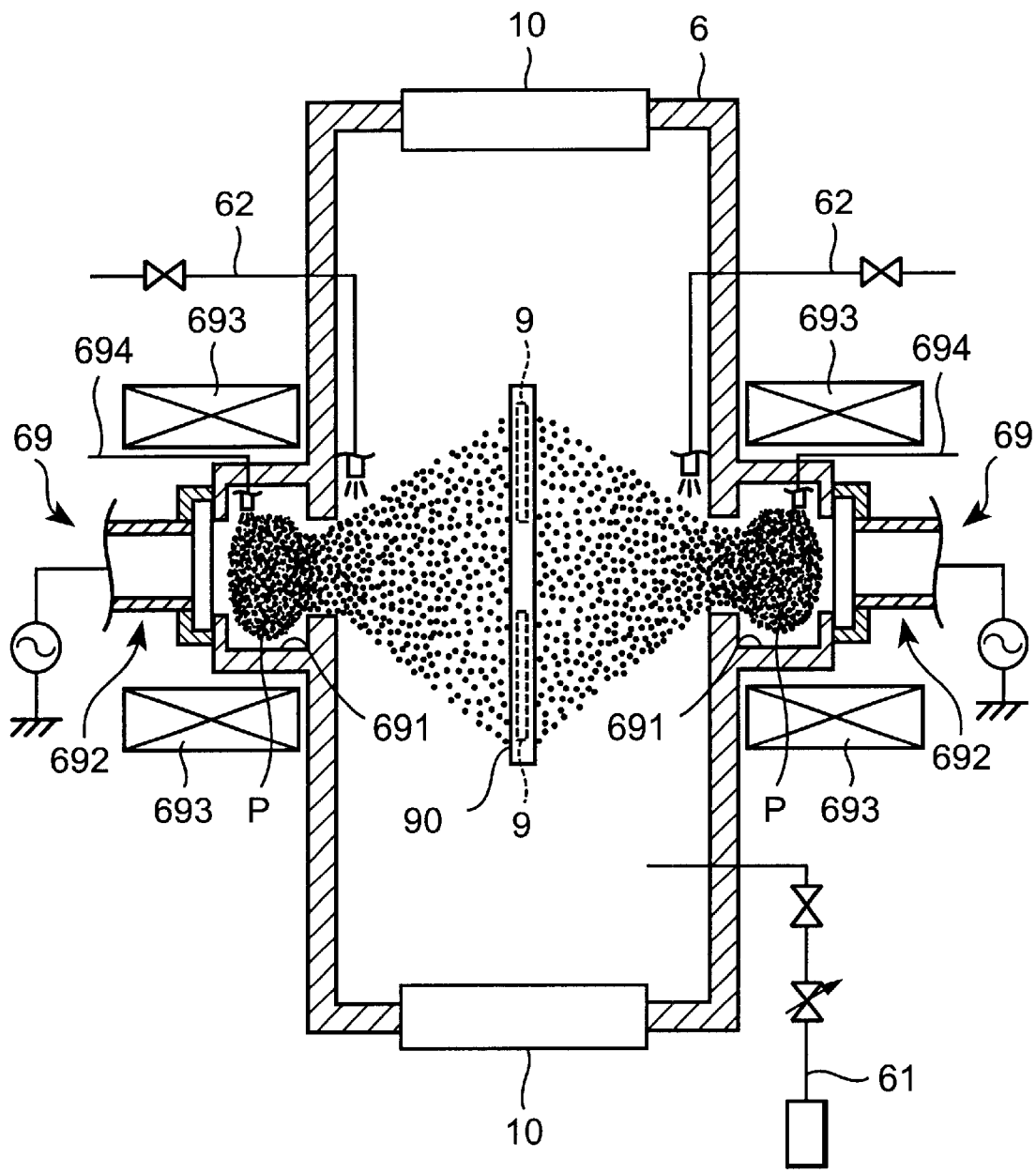
FIG. 10 is a schematic cross-sectional plan view showing the configuration of a further embodiment of the present invention wherein the protective film deposition chamber performs film deposition by electron cyclotron resonance (ECR) plasma CVD.

FIG. 10 is a schematic cross-sectional plan view showing the configuration of a further embodiment of the invention of the present application wherein protective film deposition chamber 306 performs film deposition by electron cyclotron resonance (ECR) plasma CVD. In the embodiment shown in FIG. 10, protective film deposition chamber 306 is equipped with a gas feed system 362 which introduces a process gas including a precursor gas, and an ECR plasma forming means 369 which forms an ECR plasma.

ECR plasma forming means 369 is principally configured from a plasma forming enclosure 691 which is provided in such a way that it connects with the interior of protective film deposition chamber 306, a microwave feed system 692 which introduces microwaves into plasma forming enclosure 691, an electromagnet 693 which sets up a magnetic field inside plasma forming enclosure 691 to establish the conditions for ECR, and a plasma-forming gas feed system 694 which introduces a gas for the formation of plasma. Microwave feed system 692 introduces 2.45 GHz microwaves into plasma forming enclosure 691 at a power of 100 to 140 W or thereabouts. Electromagnet 693 sets up a magnetic field of about 875 gauss inside plasma forming enclosure 691 to establish the conditions for ECR. Also, plasma-forming gas feed system 694 introduces a gas such as argon, oxygen, nitrogen or hydrogen into the interior of plasma forming enclosure 691.

The angular frequency of the introduced microwaves matches the angular frequency of electrons undergoing cyclotron motion, and the introduced plasma-forming gas is thereby efficiently ionized. As a result, an ECR plasma is formed. The ECR plasma diffuses from plasma forming enclosure 691 toward substrate 9, and the introduced precursor gas such as $CH_4$ is dissociated by this diffused plasma, whereby a thin carbon film is deposited on the surface of substrate 9. Note that a configuration may also be employed wherein the precursor gas is introduced into plasma forming enclosure by plasma-forming gas feed system 694, and a plasma of the precursor gas is formed inside plasma-forming enclosure 691.

The apparatus of the embodiments shown in FIGS. 9 and 10 is also equipped with an intermediate heating chamber in the same way as mentioned above, whereby the substrates are heated to a prescribed temperature higher than the deposition temperature when the magnetic film is deposited before the substrates are transferred to the protective film deposition chamber. Accordingly, it is possible to deposit carbon protective films with a high level of hardness on top of magnetic films with a high coercive field strength, and to contribute to the construction of high-performance data recording disks.

Note that in each of the above-mentioned embodiments, the precursor material used in the deposition of carbon protective films may be a hydrocarbon compound such as $C_2H_6$ or $C_3H_8$ or a liquid source such a $C_6H_5CH_3$ instead of $CH_4$, $C_2H_2$ or $C_2H_4$. If necessary, a gas such as $H_2$ or $N_2$ may also be added. Furthermore, materials such as CoCrPtTa may be used for the magnetic films instead of CoCrTa.

With the present invention, it is possible to obtain a structure in which a protective film with a high level of hardness is deposited on top of a magnetic film with a high coercive field strength. Accordingly, they can contribute to the construction of high-performance magnetic recording media.

Also, with the present invention there are fewer problems of increased tact time because it has an exclusive intermediate heating chamber, and it is possible to perform the magnetic film deposition, intermediate heating and protective film deposition successively under vacuum conditions so no quality degradation problems arise such as contamination of the magnetic film.

Also, with the present invention, since ions can be made to impinge on the substrate surface by applying a negative bias thereto during the protective film deposition, the hardness of the protective film increases and a protective film with more favorable characteristics is deposited.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method for depositing a protective carbon coating on a data recording disk, the method comprising:

depositing a magnetic film layer as a data recording layer on a surface of a substrate while the substrate is at a magnetic film deposition temperature;

heating the substrate with the magnetic film layer thereon to a protective carbon coating deposition temperature; and depositing a protective carbon coating on the magnetic film layer while the substrate is at the protective carbon coating deposition temperature;

wherein the protective carbon coating deposition temperature is higher than the magnetic film deposition temperature.

2. The method of claim 1, wherein the magnetic film deposition temperature is less than or equal to 230° C.

3. The method of claim 2, wherein the protective carbon coating deposition temperature is greater than 230° C.

4. The method of claim 1, wherein the protective carbon coating deposition temperature is greater than 230° C.

5. The method of claim 1, wherein the protective carbon coating is a thin carbon film.

6. A method for depositing a protective carbon coating on a magnetic film, the method comprising:

depositing a magnetic film layer on a substrate at a magnetic film deposition temperature;

heating the substrate with the magnetic film layer thereon to a protective carbon coating deposition temperature; and depositing a protective carbon coating on the magnetic film layer while the substrate is at the protective carbon coating deposition temperature;

wherein the protective carbon coating deposition temperature is higher than the magnetic film deposition temperature.

7. The method of claim 6, wherein the magnetic film deposition temperature is less than or equal to 230° C.

8. The method of claim 7, wherein the protective carbon coating deposition temperature is greater than 230° C.

9. The method of claim 6, wherein the protective carbon coating deposition temperature is greater than 230° C.

* * * * *